United States Patent [19]

Richardson

[11] 3,878,483

[45] Apr. 15, 1975

[54] VOLTAGE-TUNABLE, SEVEN-DECADE, CONTINUOUSLY-VARIABLE OSCILLATOR

[75] Inventor: Kay R. Richardson, Phoenix, Ariz.

[73] Assignee: The United States of America as represented by the Secretary of the Navy, Washington, D.C.

[22] Filed: Oct. 12, 1973

[21] Appl. No.: 406,123

[52] U.S. Cl. ............ 331/111; 331/108 D; 331/143; 331/177 R

[51] Int. Cl. .............................................. H03k 3/02

[58] Field of Search .. 331/57, 108 R, 108 B, 108 D, 331/111, 135, 143, 177 R

[56] References Cited

UNITED STATES PATENTS

| | | | |
|---|---|---|---|
| 3,512,106 | 5/1970 | Rosenthal | 331/111 |
| 3,569,865 | 3/1971 | Healey | 331/177 V X |
| 3,671,881 | 6/1972 | Yorganjian | 331/57 |

OTHER PUBLICATIONS

Electronic Design, Vol. 20, Sept. 26, 1968 p. 71.

*Primary Examiner*—Siegfried H. Grimm
*Attorney, Agent, or Firm*—Richard S. Sciacia; J. M. St.Amand; Darrell E. Hollis

[57] ABSTRACT

A voltage-tunable oscillator continuously variable over seven decades having a positive feedback circuit connected between a digital-logic gate and a first, field-effect transistor, the drain-to-source impedance of which is selectively varied by means of a potential applied to the gate thereof from an externally controlled source for establishing a desired frequency of operation. A second, field-effect transistor is connected as a source follower between said first, field-effect transistor and said digital-logic gate. The oscillator output inputs a buffer circuit having an external oscillation inhibit capability.

8 Claims, 2 Drawing Figures

VOLTAGE-TUNABLE, SEVEN-DECADE, CONTINUOUSLY-VARIABLE OSCILLATOR

BACKGROUND OF THE INVENTION

1. Field of Invention

This invention relates to oscillator circuits. More particularly to voltage-tunable, wide-range oscillators.

2. One prior art oscillator consists of an emitter coupled logic-gate operated as a free-running, bistable device by means of a resistance-capacitance network coupled thereto. The resistance comprises a field-effect transistor, the drain-to-source resistance of which is varied by means of a control-voltage applied to the gate thereof. This device has only a continuously variable, frequency range of less than three decades. In order to extend the frequency range, it is necessary to place an additional component in the feedback path which is typically accomplished with a mechanical switch.

Other prior art oscillators utilize a mechanical range switch for each decade of tuning with a reactive element as a vernier. These devices are subject to mechanical failure, are difficult to remotely program, and are difficult to use near the range switch cutoff frequencies.

Still other prior art oscillators use two oscillators beating the outputs thereof with the difference frequency as the oscillator output. These devices suffer from mechanical and/or electronic complexity, lack of tuning resolution and are limited to slow sweep rates.

SUMMARY OF THE INVENTION

The general purpose of the present invention is to provide an oscillator that is continuously-variable over a seven decade frequency range. This eliminates the necessity and attendant disadvantages of utilizing mechanical range switches and beat frequency techniques to extend the frequency range of the oscillator to seven decades. Accordingly, the present invention, a voltage-tunable, seven-decade, continuously-variable oscillator, comprises a positive feedback circuit connected between the output of a digital-logic gate and the drain of a first, field-effect transistor. The drain to source impedance of the first, field-effect transistor is selectively varied by means of a potential applied to the gate thereof from an externally controlled source for establishing a desired frequency of operation. A second, field-effect transistor is connected as a source follower between said first, field-effect transistor and the input to said digital-logic gate. The oscillator output inputs a buffer circuit having an external oscillation inhibit capability.

Accordingly, it is an object of the present invention to accomplish continuous, voltage-controlled, tuning over a seven decade frequency range.

Another object of the present invention is to minimize mechanical and/or electrical complexity.

A further object of the present invention is to eliminate mechanical tuning difficulties.

A still further object of the present invention is to increase sweep rates.

Another object of the present invention is to maximize tuning resolution.

Another object of the present invention is to minimize the probability of mechanical failure.

Still another object of the present invention is to provide a remote-control, tuning capability.

Other objects and a more complete appreciation of the invention and its many attendant advantages will develop as the same becomes better understood by reference to the following detailed description when considered in connection with the accompanying drawings.

DESCRIPTION OF THE PREFERRED EMBODIMENT

Figure 1:
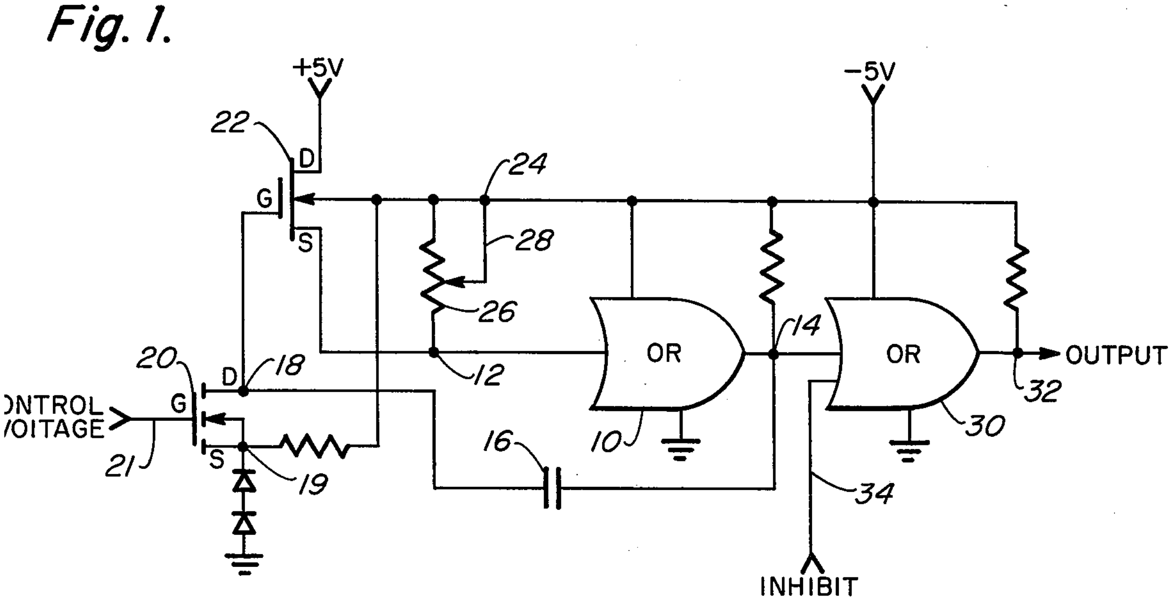
FIG. 1 is an electrical schematic diagram of a specific embodiment of the subject invention.

Referring now to FIG. 1, an OR gate 10, having input junction 12 and output junction 14, is connected at its output junction 14 to capacitor 16. OR gate 10 is a monolithic emitter coupled current mode logic circuit of the type referred to as MECL and specifically described in a publication entitled *The Microelectronics Data Book*, second edition, published by Motorola Semiconductor Products, Inc. It is noted that other logic gates may be utilized; e.g., AND, NAND, or NOR, as is well-known to one having ordinary skill in the art.

The other side of capacitor 16 is connected to junction 18. The drain of metal-oxide-silicon-field-effect transistor (MOSFET) 20 is connected to junction 18. A control voltage is connected to the gate of field-effect transistor 20 via line 21.

The gate of MOSFET 22 is connected to junction 18. The source of MOSFET 22 is connected to junction 12. The substrate of MOSFET 22 is connected to junction 24.

Potentiometer 26 is connected between junction 24 and junction 12. Wiper arm 28 is connected to junction 24.

The input to OR gate 30 is connected to junction 14. The output of OR gate 30 is connected to junction 32. OR gate 30 is identical to OR gate 10 as described supra. Junction 32 is the oscillator output. Also, junction 14 may serve as the oscillator output. An inhibit voltage inputs OR gate 30 via line 34.

The capacitor 16 connected between junctions 14 and 18 provides positive feedback which assures oscillation. MOSFET 22, connected as a source follower, in conjunction with potentiometer 26 set the operating point of OR gate 10. MOSFET 20 supplies a zero volt bias for the gate of MOSFET 22 at junction 18.

By selectively varying the magnitude of the control voltage on line 21, the drain-to-source impedance of MOSFET 20 appearing between junctions 18 and 19 varies. This variation of drain-to-source impedance of MOSFET 20 is functionally related to the frequency of output oscillations appearing at junction 32 as capacitor 16 discharges through the drain-to-source impedance of MOSFET 20.

Figure 2:
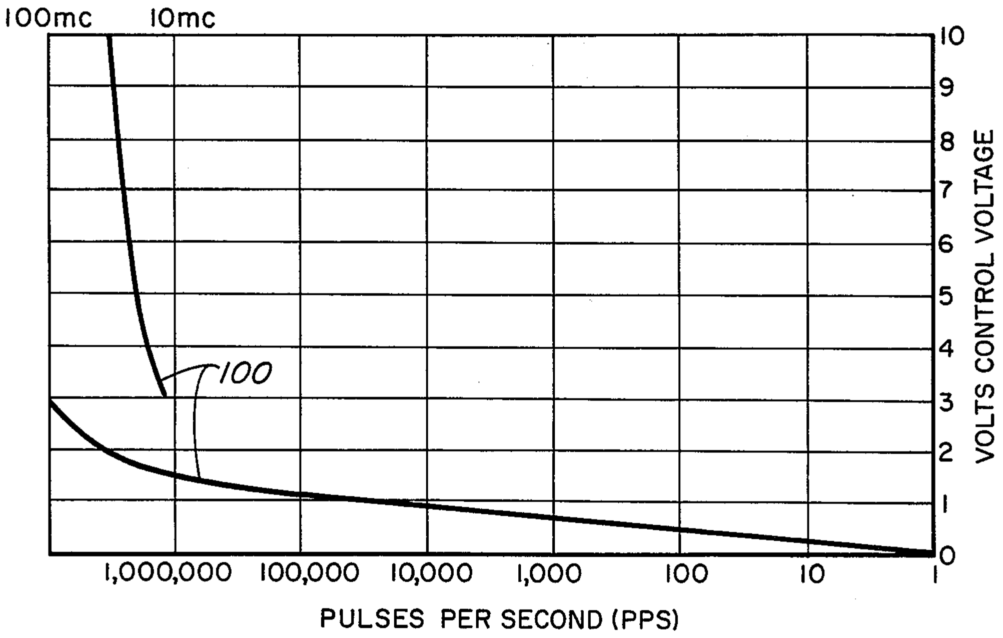
FIG. 2 is a graphical illustration of the frequency vs. control voltage characteristic of the subject invention.

The output oscillation frequency at junction 32 may be continuously varied over seven decades by the control voltage on line 21 as is illustrated in FIG. 2.

OR gate 30 functions as a buffer to prevent output loading from effecting the operation of the oscillator. The inhibit voltage on line 34 may be utilized to gate the oscillator output at junction 32 into pulse trains of varying time duration.

The applications of MOSFET transistors in combination with emitter coupled current mode logic gates are specifically suitable due to the fact that the small voltage swing of the output between −0.8 volts and −1.7 volts is sufficiently small so that it has little, if any, effect on the drain-to-source resistance of MOSFET 20 when coupled thereto.

It will be appreciated by those skilled in the art that the diodes, resistors, voltage sources, and related circuits not numbered in FIG. 1 provide biasing for the semiconductor elements of FIG. 1.

Referring to FIG. 2, curve 100 graphically illustrates the continuous, seven-decade, tuning of the oscillator of FIG. 1 by varying the control voltage on line 21 of FIG. 1.

Although a specific embodiment has been described in the foregoing, it is understood that this was included for the purpose of illustrating, but not limiting the invention. Various modifications which will come readily to the mind of one skilled in the art, are within the scope of the invention.

I claim:

1. A voltage-tunable oscillator continuously tunable over seven decades comprising:

a digital-logic-gate circuit having an input and an output, said output being the oscillator output;

a voltage-controlled, variable-impedance circuit having a control-voltage input and an output;

positive feedback means connected between said digital-logic-gate output and said variable-impedance circuit output;

a field-effect circuit having an input and an output, said input being connected to said variable impedance circuit output, said output being connected to said digital logic gate input, said field effect circuit only setting the operating point of said digital-logic-gate circuit while said oscillator output is varied over seven decades;

a variable, control voltage; and means for applying said control voltage to said variable-impedance-circuit control-voltage input whereby the frequency of oscillation is controlled.

2. The oscillator of claim 1 further comprising:

an output, buffer circuit having an input and an output, said input being connected to said oscillator output, whereby output loading of said oscillator is controlled.

3. The oscillator of claim 2 wherein said output-buffer-circuit includes:

inhibit means whereby the signal appearing at the output-buffer-circuit output is inhibited.

4. The oscillator of claim 2 wherein said output buffer circuit comprises:

a digital-logic-gate circuit.

5. The oscillator of claim 1 wherein said field-effect circuit includes:

a variable-resistance network whereby the operating point of said digital-logic-gate circuit is controlled.

6. The oscillator of claim 1 wherein said voltage-controlled, variable-impedance circuit comprises:

a field-effect transistor.

7. The oscillator of claim 1 wherein said positive feedback means comprises:

a reactance circuit.

8. The oscillator of claim 7 wherein said reactance circuit comprises: a capacitance circuit.

* * * * *